United States Patent [19]

Johnson

[11] Patent Number: 5,115,129
[45] Date of Patent: May 19, 1992

[54] PHOTOELECTRIC DEVICE WITH A LENS FORMED IN ITS HOUSING

[75] Inventor: Donald D. Johnson, Pearl City, Ill.

[73] Assignee: Honeywell Inc., Minneapolis, Minn.

[21] Appl. No.: 662,864

[22] Filed: Mar. 1, 1991

[51] Int. Cl.⁵ ............................................. H01J 5/16
[52] U.S. Cl. ................................... 250/239; 250/216
[58] Field of Search .............. 250/239, 216, 573, 353, 250/503.1, 504 R, 504 H

[56] References Cited

U.S. PATENT DOCUMENTS

| | | | |
|---|---|---|---|
| 2,756,349 | 7/1956 | Frank | 250/239 |
| 4,553,033 | 11/1985 | Hubble et al. | 250/353 |
| 4,812,003 | 3/1989 | Dambach et al. | 356/96.18 |
| 4,880,974 | 11/1989 | Yamakawa | 250/239 |

Primary Examiner—Carolyn E. Fields
Attorney, Agent, or Firm—William D. Lanyi

[57] ABSTRACT

A photoelectric device is provided which incorporates a one piece housing having a first end which is light transmissive and liquid impermeable. An opening is provided at the other end of the tubular structure for insertion of photoelectric and electronic components into the cavity of the housing structure. A cover is used to seal an opening at the second end. The cover is ultrasonically welded to the second end of the tubular structure and a cable means is provided to permit electrical current to pass through the cover at the second end of the housing structure. The first end of the tubular structure, which is transmissive to visible, infrared or ultraviolet light can be formed into one or more lenses, depending on the application of the photoelectric device. Threads are provided in the outer cylindrical surface of the housing to aid in attaching the photoelectric device to brackets with the use of threaded nuts.

19 Claims, 4 Drawing Sheets

PHOTOELECTRIC DEVICE WITH A LENS FORMED IN ITS HOUSING

BACKGROUND OF THE INVENTION

1. Field of the Invention

The present invention is generally related to photoelectric devices and, more particularly, to photoelectric devices which incorporate one or more lenses as an integral part of the housing structure for its photoelectric components.

2. Description of the Prior Art

Many types of devices for housing photoelectric components are well known to those skilled in the art. These devices can be constructed to house either single components, such as a light emitting element or a photosensitive element, or they can be constructed to house both light providing components and light sensitive components in a single housing structure. In addition, the photoelectric devices can be designed to use various types of light, such as infrared light, when a particular application requires it.

U.S. Pat. No. 4,553,033, which issued to Hubble et. al. on Nov. 12, 1985, describes an infrared reflectance densitometer. The device comprises a substrate which supports a light emitting diode, or LED, a control photodiode to compensate for component degradation, a background photodiode to compensate for background radiation and a large area photodiode to provide an electrical signal representative of the amount of toner particles on the photosensitive surface. The substrate is also used to carry a field lens which focuses light rays that are reflected from the photosensitive surface onto the signal photodiode. Also carried on the substrate is an aperture box which permits a portion of the LED light to project through the collimating lens to the photosensitive surface and a portion of the light to be reflected onto the control photodiode to control light output.

U.S. Pat. No. 4,812,003, which issued to Dambach et. al. on Mar. 14, 1989, discloses an optic sensing assembly. The assembly is intended to detect light reflection at a target area. It includes a cable holding element formed as an integral, one-piece body having sockets for directly receiving nonterminated ends of a light supply fiber optic cable and a light receiving fiber optic cable. Stop portions in the sockets accurately position the fiber optic cable ends. The housing is provided with a cavity for receiving the holding element and latch structures on the holding element and housing engage with each other to secure the holding element with stop portions positioned at a precise location relative to the housing. A strain relief structure is effective upon engagement of the latch structures for holding fiber optic cable ends within the sockets. An aperture in the housing communicates with the cavity for permitting light transmission between the cable ends and the target area. A lens structure formed integrally in the holding element directs or focuses light along paths from the cable ends to the target area.

When photoelectric devices are used in an industrial environment, they can come into contact with various types of fluids which may have a deleterious affect on the components and circuits contained within the housing of the photoelectric device. This situation is exacerbated in applications where frequent cleaning with high pressure hoses is used to assure a high degree of cleanliness with respect to the machinery or equipment with which the photoelectric devices are used. When the housing of a photoelectric device is subjected to a high velocity stream of liquid, which can comprise a cleaning solution, the liquid can enter internal portions of the photoelectric device unless the housing is specifically structured to prevent this. Although there are many techniques that can be employed to discourage the liquid from entering the internal portions of the photoelectric device, these techniques usually raise the cost of the photoelectric device and, in some cases, are not perfectly effective in protecting the photoelectric and electronic components contained within the housing structure.

The techniques known to those skilled in the art for providing a water tight housing for use in association with photoelectric components comprise the application of gaskets or O-rings and the careful configuration of mating parts in the housing. When two parts of a housing are to be associated together in contact relation, those parts are usually provided with threaded holes to allow them to be rigidly attached to each other and, in addition, the parts of the housing are shaped to receive a gasket or O-ring between them to further create an effective liquid seal. Although these techniques are generally effective in preventing liquid from intruding into the internal cavity of the housing, they can increase the cost and assembly time of the photoelectric device.

To decrease the cost of water tight housings, the number of components and the manufacturing steps required to produce the photoelectric device must be decreased. The present invention is directed to solve these problems described above and providing a simplified, but liquid tight, housing for a photoelectric device.

SUMMARY OF THE INVENTION

In order to address the problems described above, the photoelectric device of the present invention comprises a one-piece housing structure that, in turn, comprises a generally tubular portion having a first end and a second end. The first end of the tubular portion is formed as an integral part of the tubular portion and is both fluid impermeable and light transmissive for visible, infrared and ultraviolet light. The second end of the tubular portion comprises an opening in the housing structure. A cover is shaped to be received in the opening of the second end with the cover being disposed in fluid sealing association with the opening to prevent fluid from passing into the housing structure through the second end. The one piece housing structure and the cover, which have been described above, are combined to form the housing of the photoelectric device.

Within the one piece housing structure described above, a photosensitive element is disposed in optical communication with the first end of the generally tubular portion. An electrical circuit is disposed within the housing and connected in electrical communication with the photosensitive element. In addition, a means for conducting an electrical current through the cover is provided by the present invention and the conducting means is connected in electrical communication with the electrical circuit.

In a particularly preferred embodiment of the present invention, the first end of the one piece housing structure is shaped to form a lens. In one of several alternative embodiments of the present invention, the first end of the one piece housing structure is shaped to form two lenses. The photosensitive element disposed within the housing structure can be accompanied by a light source in that particular alternative embodiment of the present invention. It should be understood that, in other alternative embodiments, three or more lenses can be formed in the first end of the one piece housing.

When the cover is disposed into the opening of the one piece housing structure during manufacture, it is ultrasonically welded to the second end of the housing structure in a preferred embodiment of the present invention. In alternative embodiments, the cover can be attached to the second end of the housing structure with epoxy or a suitable adhesive. In addition, in a preferred embodiment of the present invention, the conducting means described above is disposed in an electrically insulative covering which is molded directly into the cover with the cover being fused to the electrically insulative covering of the conducting means. Also in a preferred embodiment of the present invention, an outer surface of the tubular portion is threaded to receive one or more nuts.

By providing a one piece housing structure as described above, the present invention prevents any possible leakage of liquid through the area surrounding the lens of the photoelectric device. Since the lens is formed directly into the cylindrical housing structure, no cracks exist between the housing structure and the light transmissive end of the tubular portion. This eliminates the need for any sealing technique to be used between these components since they are completely integral with each other and formed as one piece. In addition, the ultrasonic welding of the cover to the second end of the housing structure prevents leakage through the back portion of the housing structure.

BRIEF DESCRIPTION OF THE DRAWING

The present invention will be more fully understood from a reading of the description of the preferred embodiment in conjunction with the drawing, in which.

DESCRIPTION OF THE PREFERRED EMBODIMENT

Figure 1:
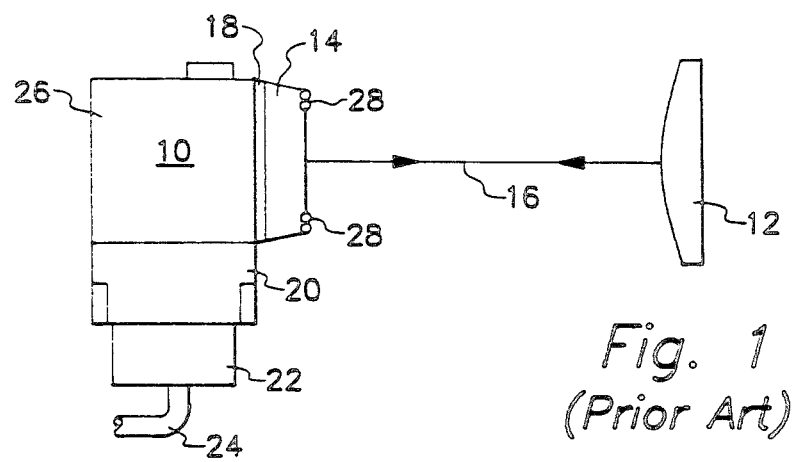
FIG. 1 illustrates a known type of photoelectric device used in a retroreflective type of application.

Throughout the description of the preferred embodiment, like components will be identified with like reference numerals.

Figure 2:
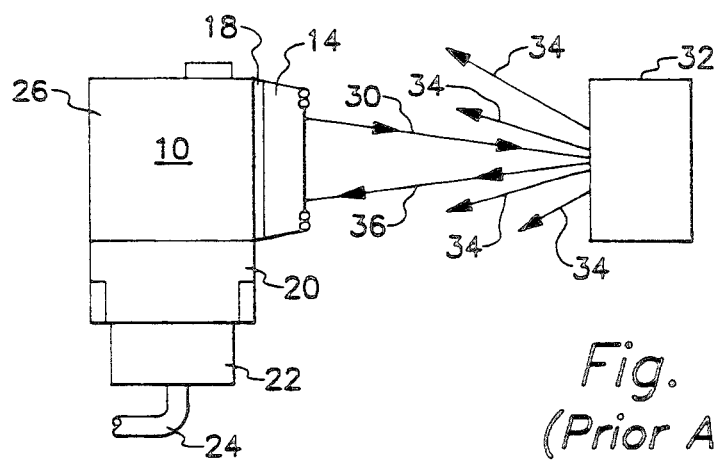
FIG. 2 shows a known type of photoelectric device applied in a diffuse application.
Figure 3:
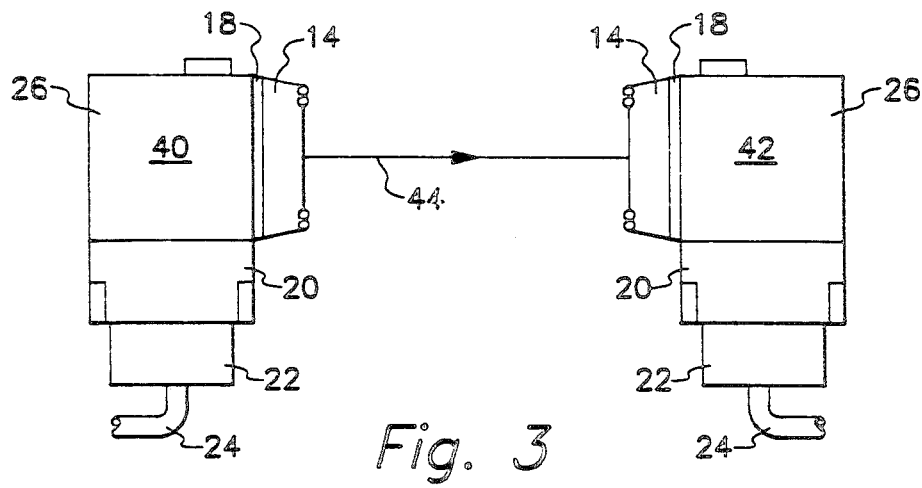
FIG. 3 shows two known types of photoelectric devices used in a thru type of application.

FIGS. 1, 2 and 3 illustrate applications of photoelectric devices which are known to those skilled in the art. Furthermore, the types of photoelectric devices illustrated in FIGS. 1, 2 and 3 are also well known to those skilled in the art of manufacturing photoelectric devices and to those skilled in the art of applying these types of devices.

In FIG. 1, a photoelectric device 10 is shown assembled in association with a reflector 12. A light source within the photoelectric device 10 provides a beam of light which is emitted from the front portion 14 of the photoelectric device 10 and is transmitted toward the reflector 12. When the beam of light strikes the reflector 12, it is reflected back toward the photoelectric device 10. This transmission and reflection of light is indicated by the light beam 16 with its opposing arrowheads.

With continued reference to FIG. 1, it should be noted that the photoelectric device 10 comprises several portions. For example, the front portion 14 is connected to a main housing section 26, with a gasket 18 disposed between them. Other portions 20 and 22, which are typically part of a single integral component, are combined with the main portion 26 to form the total housing structure of the photoelectric device. A electrically conductive device, such as the electrical cable 24 is used to provide power to the photoelectric device 10. In order to provide a liquid tight housing, gaskets such as that which is identified by reference numeral 18 are used between mating components. In addition, screws 28 are used to attach separate parts of the housing structure to the other parts.

In operation, the assembly shown in FIG. 1 transmits a light beam from a light emitting device within the housing structure 10. The light beam is reflected by the reflector 12 and returns to a photosensitive device, such as a photodiode or a photoresistor, within the housing structure 10. As long as the reflected signal is received by the photosensitive device, the photoelectric device detects no object between itself and the reflector. If a component passes between the photoelectric device 10 and the reflector 12, the light beam is broken and a signal can be transmitted by the photoelectric device to indicate the presence of an object between the photoelectric device and its reflector. This type of application, as shown in FIG. 1, is known to those skilled in the art as a retroreflective application.

FIG. 2 shown an application of a photoelectric device which is referred to by those skilled in the art as a diffuse application. The photoelectric device 10 transmits a beam of light 30 from its front portion 14. The beam of light 30 strikes an object 32 and the light from the beam 30 is deflected in many directions as represented by arrows identified with reference numeral 34. Some of the light reflected from the object 32 passes along light beam 36 and is received by a photosensitive component within the photoelectric device 10. Receipt of a return signal, such as that illustrated by light beam 36, indicates the presences of an object 32 in the target area. If no signal is received by the photosensitive element in the photoelectric device, it is presumed that no object 32 is present in the target area FIG. 3 illustrates a different type of photoelectric application. A light source, such as photoelectric device 40, is associated with a light sensitive component, such as photoelectric device 42, to detect the presence of an object between the two devices. A light beam is transmitted from the front portion 14 of photoelectric device 40 and travels, as indicated by light beam 44, toward a photosensitive component within photoelectric device 42. If an object passes between the two photoelectric devices shown in FIG. 3, no light will be received by photoelectric device 42 and the presence of an object between the two devices will be detected.

The three examples described above in conjunction with FIGS. 1, 2 and 3 illustrate two important issues which are addressed by the present invention. First, it should be noted that photoelectric devices 10, 40 and 42 in FIGS. 1, 2 and 3 each comprise numerous sections or portions as part of their housings structures. For simplicity, these components are identified similarly in each of the figures. It should also be understood that several components used in constructing the housing of the photoelectric devices are not visible in the views provided in FIGS. 1, 2 and 3. In order to make the housings leak proof, several gaskets and/or O-rings are used and, to attach the various components of the housing to the other components, numerous screws or other attachment means are utilized.

From observing FIGS. 1, 2 and 3, it should also be noted that the photoelectric devices can contain one or more photoelectric elements. In other words, the device can incorporate a single light emitting device such as in the case of photoelectric device 40 in FIG. 3 or a single photosensitive element such as in the case of photoelectric device 42 in FIG. 3. Alternatively, the photoelectric device can comprise both a light transmitting element, such as a light emitting diode, and a light sensitive element, such as a photodiode or a photoresistor. This is the case in photoelectric device 10 in both FIGS. 1 and 2. The present invention provides an improved housing structure for use with any of the three types of devices illustrated in FIGS. 1, 2 and 3. In other words, the housing of the present invention can incorporate a light transmissive portion which, in turn, comprises one or more light transmissive segments. Those one or more light transmissive segments can additionally be formed to provide lenses which focus light passing into or out of the housing structure.

Figure 4:
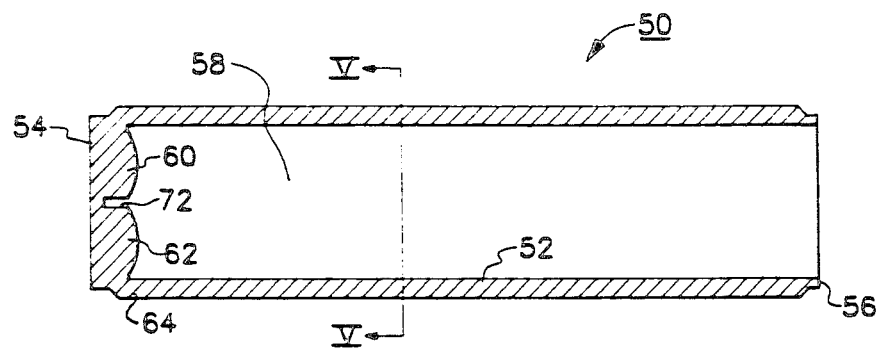
FIG. 4 shows the one piece housing structure of the present invention.

With reference to FIG. 4, the present invention provides a photoelectric device that comprises a one piece housing structure generally indicated by reference numeral 50. The housing structure 50 comprises a generally tubular portion 52 which has a first end 54 and a second end 56. The first end 54 is an integral part of the tubular portion 52 and is light transmissive and fluid impermeable. The housing structure shown in FIG. 4 is one single piece with the first end 54 and the tubular portion simultaneously formed as an integral unit. The second end 56 of the housing structure 50 is an opening at a end of the tubular structure 52 opposite the first end 54.

As can be seen in FIG. 4, the housing structure 50 is shaped to provide a cavity 58 into which components of a photoelectric device can be disposed. As can also be seen in FIG. 4, the first end 54 of the one piece housing structure 50 can be provided with lenses 60 and 62 formed in it. It must be understood that lenses 60 and 62 are formed as an integral part of the first end 54 which, in turn, is formed as an integral part of the cylindrical portion 52 of the housing 50. Although two lenses 60 and 62 are shown in FIG. 4, it should be understood that the present invention can be formed with one single lens, or, alternatively, with no lens structure other than a light transmissive flat portion at the first end 54. Depending on the need for a light focusing characteristic at the first end 54, one or more lenses can be provided and formed into the first end 54 or, alternatively, a simple flat first end 54 can be provided with no lens shape incorporated in it. The outer cylindrical surface 64 of the housing structure 50 can be threaded so as to be able to receive one or more threaded nuts onto the outer cylindrical surface for assisting the attachment of the housing structure 50 to a bracket.

Figure 5:
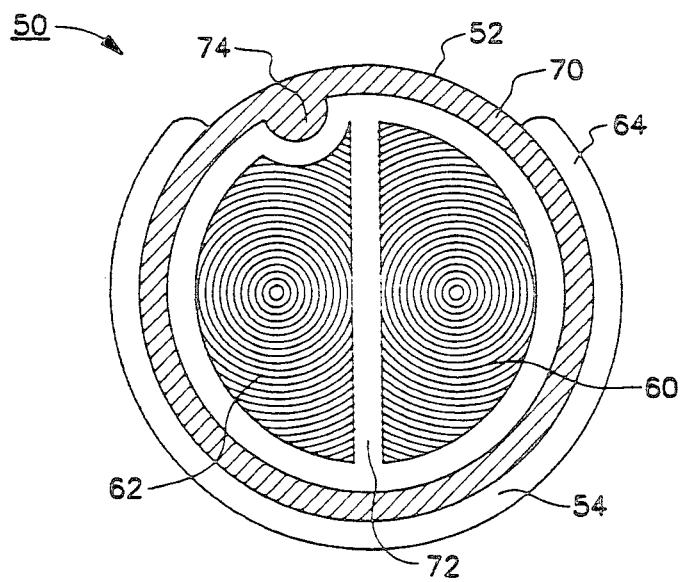
FIG. 5 shows a sectional view of the housing shown in FIG. 4, illustrating the lenses in the end of the housing.

FIG. 5 is a section view taken of FIG. 4. It shows the lenses, 60 and 62, formed into the first end of the housing structure. In addition, FIG. 5 shows the cylindrical, or tubular, portion 52 with threads 64 formed in its outer cylindrical surface. As shown in FIG. 5, the threads 54 are only formed partially around the tubular structure 52. This leaves an unthreaded portion 70 which can be used for identification purposes. FIG. 5 also shows the indented groove 72 between the lenses, 60 and 62, which serves an important purpose in association with the present invention. That purpose will be described in greater detail below, but with reference to FIG. 5 it should be understood that the indented portion 72 is shaped to receive a light barrier disposed between light receiving and light transmitting elements. Protrusion 74 is provided as an alignment aid. It is formed in the inner cylindrical surface of the tubular portion 52 and extends partially along the length of the tubular portion approximately half way along the length between the first and second ends. It provides a valuable service during assembly of the photoelectric components within the housing structure 50. While the embodiment illustrated in FIG. 5 is shown as having lenses, 60 and 62, formed in its first end 54, it should be understood that a relatively flat first end 54 can be provided in the housing structure if little or no light focusing characteristics are required.

Figure 6:
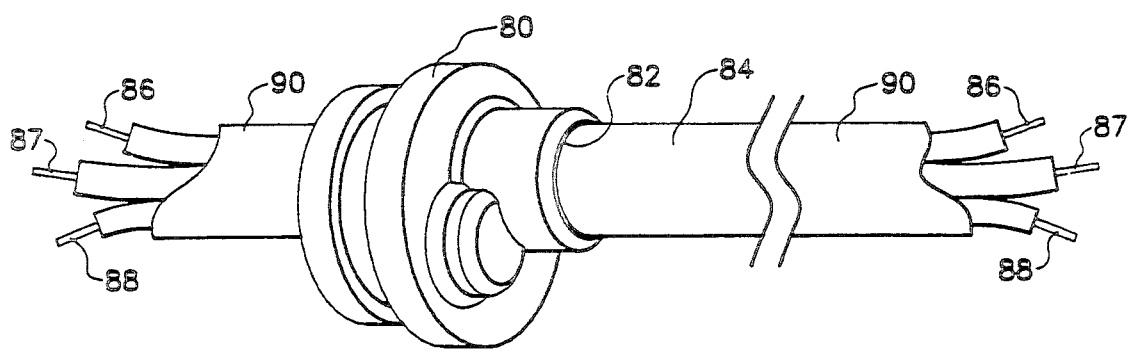
FIG. 6 illustrates the cover of the present invention assembled with a means for conducting an electrical current through the cover.

FIG. 6 illustrates a cover 80 which is shaped to be received in the opening of the second end 56 of the housing shown in FIG. 4. The cover 80, in FIG. 6, is shown as being provided with an aperture 82 through which an electrically conductive device 84 extends. The electrically conductive device 84 provides a means for conducting an electric current through the cover 80. As can be seen, three electrical conductors, 86, 87 and 88, extend through an electrically insulative covering 90 which, in turn, extends through the cover 80. As will be described in greater detail below, it is very important that the attachment of the cover 80 and the means for conducting the current 84 be impermeable to liquids. To accomplish this, the material of the cover 80 is caused to be fused to the covering 90 of the electrical conducting means 84. This is accomplished by disposing the electrical conducting means 84 in the mold which is used to form the cover 80. After passing the electrical conducting means 84 through an opening in the mold, the molten material used to form the cover 80 is poured into the mold and around the covering 90 of the electrical conducting means 84. The heat of the molten material of the cover 80 causes this cover material to fuse to the material of the covering 90. This fusing of the two materials creates a very reliable and liquid impermeable connection between the covering 90 and the cover 80. The assembly shown in FIG. 6 provides a means for passing an electrical current through the cover 80 between devices outside of the housing structure of the photoelectric device to components disposed within the cavity of the housing structure 50. This will be described in greater detail below.

Figure 7:
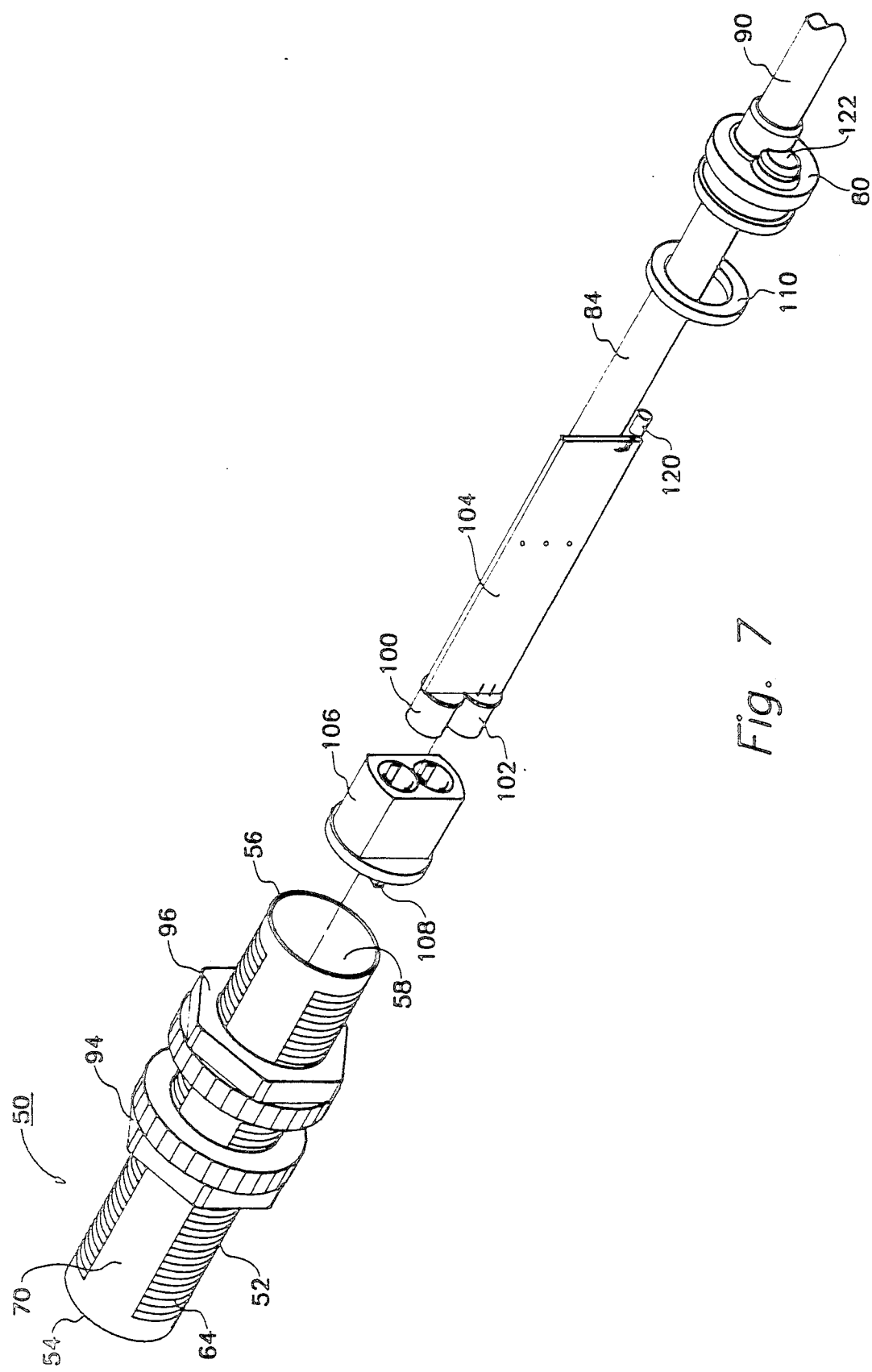
FIG. 7 illustrates one embodiment of the present invention.

FIG. 7 shows one application of the housing structure of the present invention. The housing 5 of the present invention is shown with its first end 54 and its second end 56. The internal cavity 58 of the housing structure 50 is also identified in FIG. 7. Threads 64 are provided in the outer cylindrical surface of the tubular portion 52. These threads 64 are shaped to receive threaded nuts, 94 and 96, for use in attaching the housing structure 50 to a bracket. For purposes of simplicity and clarity, no bracket is shown in FIG. 7. However, it should be clearly understandable how a bracket plate can be disposed between the two nuts, 94 and 96, and grasped between the two nuts to support and hold the entire assembly shown in FIG. 7.

Also shown in FIG. 7 are two photoelectric components. A light source 100 and a photosensitive element 102 are shown attached to a printed circuit board 104 which comprises numerous electronic components needed by the light source 100 and the light sensitive element 102. For purposes of clarity and simplicity, the side of the printed circuit board 104, with components attached is not shown in FIG. 7. However, the circuit supported on the printed circuit board 104 is a type which is very well known to those skilled in the art and the specific type of circuit is not significant to the scope of the present invention. A light directing device 106 is shaped to receive both the light emitting component 100 and the light sensitive component 102 within its preformed cavities. This can be seen in FIG. 7. The light directing device 106 is also provided with a blade-like portion 108 that is shaped to be received in the indented portion 72 of the first end 54 of the housing 50. The indented portion 72 of the first end 54 is illustrated in FIGS. 4 and 5. The view shown in FIG. 7 does not specifically illustrate that indented groove, but it should be understood that the blade-like portion 108 of the light directing device 106 is shaped to be received in that groove to prevent transmission of light between the components identified by reference numerals 100 and 102. Also shown in FIG. 7 is the cover 80 and the associated means for conducting electrical current through the cover which is identified by reference numeral 84. The means for conducting electrical current 84 is connected in electrical communication with the electrical circuit contained on and supported by the printed circuit board 104. The item identified by reference numeral 110 in FIG. 7 is a pad installed on cover 80. When assembled, the components shown in FIG. 7 are inserted into the cavity 58 of the housing structure 50. The light directing device identified by reference numeral 106 is inserted into the cavity 58 with the blade-like portion 108 being inserted into the indented groove 72. Photoelectric elements 100 and 102 are inserted into the cavities of the light directing device 106 and the entire assembly shown associated with the printed circuit board 10 is inserted into the cavity 58. The second end 56 of the housing structure 50 is shaped to receive the cover 80 and the cover 80 is therefore inserted into the opening in the second end 56. After inserting the cover 80 into the second end 56, the cover 80 is ultrasonically welded to the second end 56 of the housing structure 50. Since, as discussed above, the cover 80 is fused to the covering 90 of the electrical conducting means 84, the operation described above provides a housing structure that is impermeable to liquids even when a direct stream of high velocity liquid is caused to impinge directly on the photoelectric device.

In FIG. 7, a light emitting device 120 is shown attached in electrical communication with the printed circuit board 104. In addition, a viewing window 122 is provided as part of the cover 80. The light emitting device 120 can be viewed through the viewing window 122 from the back side of the housing structure. In some embodiments of the present invention, the light emitting device 120 is used to indicate that the photosensitive device contained within the housing 50 has sensed an object in its light path.

Figure 8:
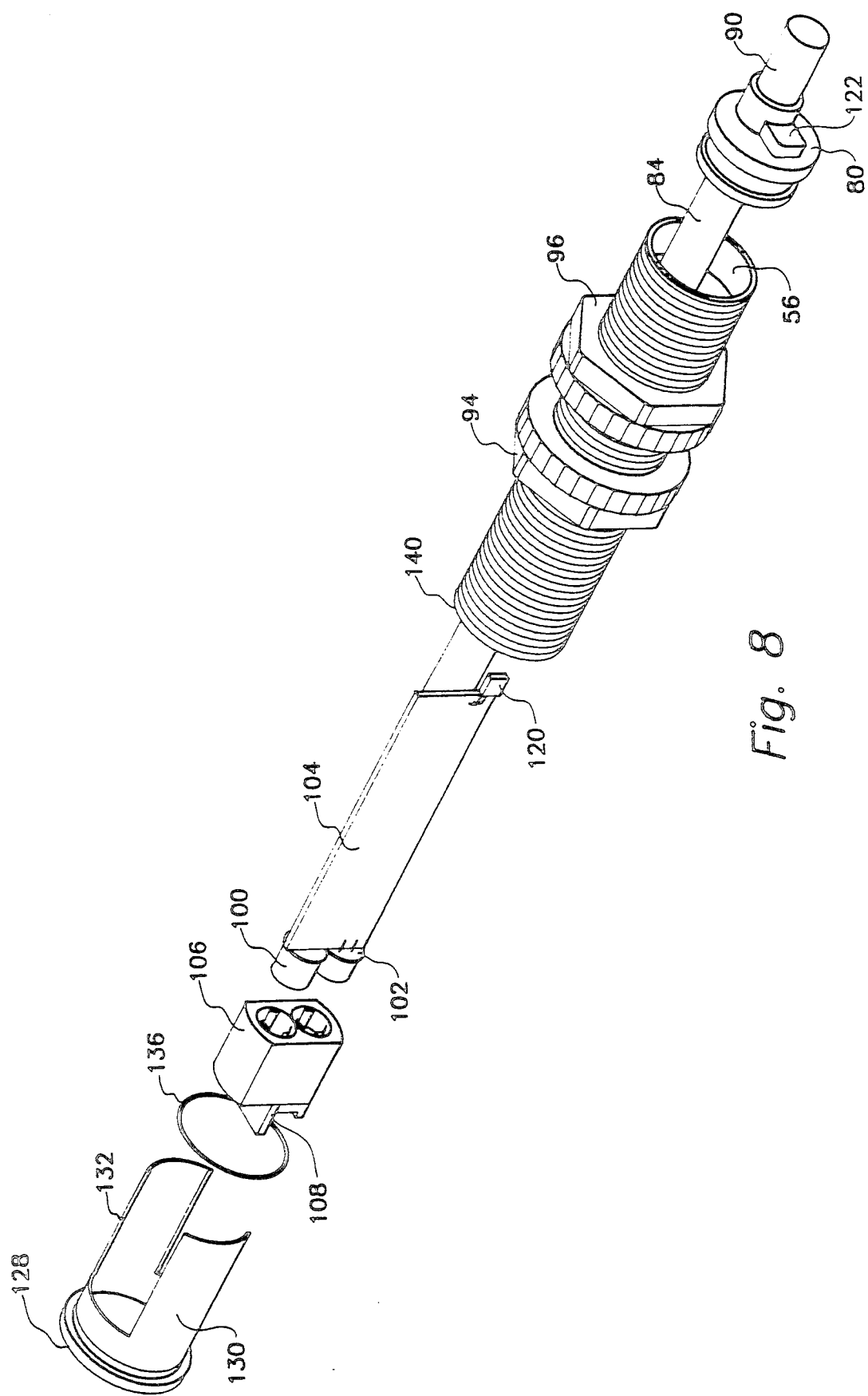
FIG. 8 shows an example of the prior art.

The present invention provides significant benefits when compared to housing structures for photoelectric devices that are known to those skilled in the art. FIG. 8 illustrates one type of known device. In previous photoelectric devices, a separate lens structure 128 is attached to a housing structure. This attachment is usually provided either by clamping a lens member to the housing structure with a gasket 136 therebetween or, alternatively, by placing a lens structure at one open end 140 of a tubular member while potting material is poured into the cavity of the tubular housing member to encapsulate the electronic components contained therein. When this latter procedure is performed, the potting material also encapsulates legs, 130 and 132, which are attached to the lens member 128 and the lens is therefore rigidly connected to both the housing structure and the potting material disposed therein. As can be seen in FIG. 8, the legs 130 and 132 are necessary to firmly anchor the lens member 128 within the potting material that is inserted into the cavity of the tubular housing structure. The radial thickness of these legs diminishes the available circular area at the front end of the lens member than can be used as the light transmissive portion. This available circular area is further reduced by the additional necessity of a circumferential lip, or edge, that is shaped to receive the gasket 136 and fit against the circular first end 140 of the tubular housing structure. Although it adds expensive manufacturing steps to the production of photoelectric devices, the potting procedure also does not absolutely guarantee a liquid impermeable structure. The other components shown in FIG. 8 are generally similar to their identically identified counterparts shown in FIG. 7 with the exception of the connection between the cover 80 and covering 90 which are not fused together but, instead, attached together with an adhesive. The present invention reduces the steps needed to manufacture a photoelectric device, reduces the cost of the device and, most importantly, provides a liquid impermeable structure to house the photoelectric device made in accordance with its concepts. Although the present invention has been described with significant detail, it should be understood that alternative embodiments are within its scope.

The embodiments of the invention in which an exclusive property or right is claimed are defined as follows:
1. A photoelectric device comprising:
    a one piece housing structure, said housing structure comprising a generally tubular portion having first and second ends, said first end being an integral part of said tubular portion, said second end comprising an opening, said first end being fluid impermeable, light transmissive and shaped to form at least one lens;
    a photosensitive element disposed within said housing structure, said photosensitive element being disposed in optical communication with said first end;
    an electrical circuit disposed within said housing structure, said electrical circuit being connected in electrical communication with said photosensitive element; and
    a cover shaped to be received in said opening, said cover being disposed in fluid sealing association with said opening to prevent fluid from passing into said housing structure.
2. The device of claim 1, wherein:
said first end is shaped to form two lenses.
3. The device of claim 2, further comprising:

a light source disposed within said housing structure, said light source being connected in electrical communication with said electrical circuit, said light source being disposed in optical communication with a preselected one of said two lenses.

4. The device of claim 1, wherein:
said cover is welded to said second end of said housing structure.

5. The device of claim 1, wherein:
an outer surface of said tubular portion is threaded to receive a threaded nut.

6. The device of claim 1, wherein:
said first end is transmissive to infrared light.

7. The device of claim 1, wherein:
said first end is transmissive to visible light.

8. The device of claim 1 wherein:
said first end is transmissive to ultraviolet light.

9. A photoelectric device, comprising
a one piece housing structure having a closed end and an open end, said housing structure being generally cylindrical, said closed end being light transmissive and shaped to form at least one lens;
a photoelectric component disposed in the said housing structure; and
a cover shaped to be received in said open end of said housing structure, said cover being disposed in fluid sealing association within said open end;
a means for conducting an electrical current into said photoelectric device, said conducting means being connected in electrical communication with said photoelectric component.

10. The device of claim 9, wherein:
said photoelectric component is disposed in optical communication with said at least one lens.

11. The device of claim 9, wherein:
said closed end is shaped to form two lenses.

12. The device of claim 11, wherein:
said photoelectric component comprises a photosensitive element and light emitting element, said photosensitive element being disposed in optical communication with a first one of said two lenses and said light emitting element being disposed in optical communication with a second one of said two lenses.

13. The device of claim 9, wherein:
said photoelectric component comprises an infrared light emitting diode.

14. The device of claim 9, wherein:
said photoelectric component comprises a photosensitive element which is sensitive to infrared light.

15. The device of claim 9, wherein:
said generally cylindrical housing structure comprises threaded outer cylindrical surface.

16. A photoelectric device, comprising:
a one piece housing structure, said housing structure comprising a generally cylindrical portion with a first end and a second end, said first end being an integral portion of said cylindrical portion, said second end being an opening of said housing structure, said first end being light transmissive and shaped to form at least one lens;
a photoelectric element disposed within said housing structure, said photoelectric element being disposed in optical communication with said first end;
a cover shaped to be received in said second end, said cover being disposed in fluid sealing association with said opening; and
means for conducting an electrical current between said photoelectric element and an external device, said conducting means being connected in electrical communication with said photoelectric element.

17. The device claim 16, wherein:
said cover is welded to said housing structure;
said conducting means is disposed in an insulative covering; and
said covering is fused to said aperture of said cover.

18. The device of claim 16, wherein:
said first end is shaped to form two lenses.

19. The device of claim 18, wherein:
said photoelectric element comprises a photosensitive element and a light emitting element, said photosensitive element being disposed in optical communication with a first on of said two lenses and said light emitting element is disposed in optical communication with a second one of said two lenses.

* * * * *